United States Patent [19]

Aoki

[11] Patent Number: 5,361,214
[45] Date of Patent: Nov. 1, 1994

[54] METHOD FOR AUTOMATICALLY DETERMINING WIRING ROUTES

[75] Inventor: Takahiro Aoki, Kanagawa, Japan

[73] Assignee: Kabushiki Kaisha Toshiba, Kawasaki, Japan

[21] Appl. No.: 727,431

[22] Filed: Jul. 9, 1991

[30] Foreign Application Priority Data

Jul. 9, 1990 [JP] Japan .................................... 2-179510
Nov. 27, 1990 [JP] Japan .................................... 2-320997

[51] Int. Cl.$^5$ ............................................. G06F 15/60
[52] U.S. Cl. .................................. 364/490; 364/489; 364/488
[58] Field of Search ................ 364/488, 489, 490, 491

[56] References Cited

U.S. PATENT DOCUMENTS

| 4,495,559 | 1/1985 | Gelatt, Jr. et al. | 364/491 |
|---|---|---|---|
| 5,200,908 | 4/1993 | Date et al. | 364/491 |
| 5,202,840 | 4/1993 | Wong | 364/490 |
| 5,208,759 | 5/1993 | Wong | 364/491 |

OTHER PUBLICATIONS

"A Placement Algorithm for Array Processors" by Chyan et al., IEEE 20th Design Automation Conference, 1987, pp. 182-188.

"A Parallel Processing Approach for Logic Module Placement" by Ueda et al., IEEE Trans. on Computer-Aided Design, vol. CAD-2, No. 1, Jan. 1983, pp. 39-47.

"Placement by Simulated Annealing on a Multiprocessor" by Kravitz et al., IEEE Trans. on Computer-Aided Design, vol. CAD-6, No. 4, Jul. 1987, pp. 534-549.

*Primary Examiner*—Vincent N. Trans
*Attorney, Agent, or Firm*—Oblon, Spivak, McClelland, Maier & Neustadt

[57] ABSTRACT

A method for automatically determining wiring routes among terminals comprising separating the terminals to a group of two-terminal units in which the Manhattan length between two terminals in a unit is statistically shortened to the minimum, calculating a specific length L between the two terminals, roughly determining all the wiring routes connecting each two-terminal unit in which the distance between the two terminals is larger than the specific length L, dividing the routing area into a group of small areas, composing a group of medium areas which are respectively formed by combining four small areas in close proximity, roughly and simultaneously determining all wiring routes of the two-terminal units In which the distance between the two terminals is smaller than the specific length L in the medium areas conceivable as the combination of four small areas in close proximity.

13 Claims, 16 Drawing Sheets

DISTANCE BETWEEN TWO TERMINALS

PT-A

PT-B

PT-C

PT-D

METHOD FOR AUTOMATICALLY DETERMINING WIRING ROUTES

BACKGROUND OF INVENTION

1. 1. Field of the Invention

The present invention relates to a method for automatically determining wiring routes among terminals which are arranged on an integrated circuit, and in particular to a method for automatically determining wiring routes for designing a wiring pattern of a semiconductor integrated circuit.

2. 2. Description of Background Art

Recently, to automatically design a wiring pattern of a semiconductor integrated circuit, layout CAD programs which are operated by utilizing a general-purpose computer have been developed.

The automatic design is made up of two procedures. A first procedure is a global routing procedure for roughly determining wiring routes. The global rough wiring route is called a global route. A second procedure is a detail routing procedure for precisely determining a final routing pattern according to the global routes determined by the first procedure. The final routing pattern determined by the detail routing procedure is called a detail route.

In the global routing procedure, initially, a routing area is divided into global routing cells of which the side length is larger than the interval of the actual wires. Therefore, the maximum number of detail routes which can pass through a global routing cell in parallel is determined by the side length of the cell. The maximum number is called wiring capacity. The global route is determined without exceeding the wiring capacity in the global routing procedure.

In the detail routing procedure, the final routing pattern is determined according to the global routes.

The first procedure and the second procedure for respectively determining the global route and the detail route are described as an example with reference to FIG. 1 as follows.

As shown in FIGS. 1(a) to 1(d), a pair of numbered terminals, which are set to the same electric potential, are connected to determine the wiring routes in a routing area 210. To roughly determine the wiring route among the terminals, two typical wiring methods are known.

One is a maze method (C.Y. Lee, "An Algorithm for Path Connections and Its Applications", IRE Trans. Electron. Comput., Vol. EC-10, pp. 346-365, 1961). The other is a segment search method ( K. Mokami etc., "A Computer Program for Optimal Routing of Printed Circuit Connections", IFIPS Proc., pp. 1475-1478, 1968).

In the conventional automatic wiring methods such as the maze method or the segment search method, wiring routes 211 between like-numbered terminals are determined serially as shown in FIGS. 1(a) to 1(d). However, the above automatic wiring method increases the processing time and enlarges the circuit.

In recent semiconductor integrated circuits, many drawbacks have occurred as the complexity of integrated circuits advances. That is, the processing time required for the layout of the wiring route is rapidly increased. For example, when the number of parts integrated in the semiconductor is M, the processing time is proportional to $M^2$. In short, the increase in processing time required for the layout is greater than the improvement in executing speed in the general-purpose computer.

To solve those drawbacks, recently, an automatic wiring route determination method for executing a wiring process by utilizing a plurality of processors in parallel has been proposed (H. Nelson Brady, "MIMD Organization for the Execution of Interconnection Routing Algorithm", IEEE Circuits and Device Magazine, pp. 39-43, 1985, first published in Japanese Patent Publications No. s62-115574, and s62-186351).

One example of the above method is described as follows with reference to FIG. 2.

As shown in FIG. 2, a pair of terminals with like numbers are connected to determine wiring routes. In this parallel wiring method, initially, a routing area 210 is divided into a plurality of small areas 220, 221, 222, 223 (four in this example) as shown in FIG. 2(b). And then, wiring routes between a pair of like-numbered terminals and is included in the same small area are determined as shown in FIG. 2(c). In this example, the routes between terminals 1, 1, terminals 2, 2, ---, and terminals 6, 6 are respectively determined. When all the wiring routes have been determined, the processing is stopped. On the other hand, when no wired terminals exist, some small areas are combined to compose a larger new small area. In FIG. 2(c), because no wired terminals 7, 8, 9, and 10 exist, the small areas 220 to 223 are combined to compose a new small area 225 (in this example, the area 225 is the same as the routing area 210). And then, the wiring routes between the terminals included in the area 225 are determined. Moreover, when no wired terminals still exist, the combination of the small areas is repeated to determine the all wiring routes.

For example, when the routing area 210 is divided into N small areas to process by using N processors, the all N processors can be operated in a first step. That is, the processing is executed in parallel N times. Thereafter, some small areas are combined to compose a new small area before determining the wiring routes of non-wired terminals in the new small area in a second step. To simplify the wiring procedures, four (2×2) small areas in close proximity are combined to compose a new small area. That is, the routing area 210 is divided into N/4 small areas. Therefore, N/4 processors can be operated to determine the wiring routes in the second step. That is, the other processors are not needed. In the same manner, N/16 processors can be operated to determine the wiring routes in a third step. That is. the other (N−N/16) processors are not needed.

Accordingly, in the parallel wiring method as described in the above example, the small areas including no wired terminals are combined to compose a new small area. Therefore, the number of the divided small areas is decreased while the wiring process proceeds. That is, the number of processors operated in parallel is decreased so that the number of unused processors increases.

On the other hand, a distribution graph of a wiring number is shown in FIG. 3. The distribution is determined according to the layout of a typlcal real circuit.

As shown in FIG. 3, the abscissa corresponds to a group of cut lines 130. The cut lines 230 are positioned in the routing area 210 as shown in FIG. 4. The ordinate indicates the number of wires across a corresponding cut line 130. Judging from the distribution. the number of wires being across each cut line 130 is almost equal over the entire routing area 210.

Accordingly, in the parallel wiring method described in the above example, because the wire is necessarily across the boundary line between the small areas, the small areas in the first step must be combined step by step to finally compose the largest small area which is identical to the routing area 210 to complete the wiring process.

As mentioned above, in the conventional automatic wiring method, the wiring process of a large scale circuit can not be completed in a practical process time. Also, it is inefficient to use the above method in the parallel wiring method to solve the above drawback.

As mentioned above, in the conventional automatic wiring method, the small areas are processed one by one by using one general-purpose computer. Therefore, the layout of a large scale integrated semiconductor is impossible to be executed in a practical processing time, even using the highest speed computer now in existence.

SUMMARY OF THE INVENTION

A first object of the present invention is achieved by the provision of a method for automatically determining wiring routes among terminals which are arranged on a routing area and have the same electric potential, comprising:

separating the terminals to a group of two-terminal units in which the Manhattan length between two terminals in a unit is statistically shortened to the minimum on condition that all the terminals are electrically connected through wiring routes connecting each two-terminal unit;

calculating a specific interval L between the two terminals, the interval L corresponding to a prescribed cumulative value in a statistical distribution of the distance between two terminals in the unit and being equal to the larger of a interval $\Delta x$ between the two terminals in a first direction X and another interval $\Delta y$ between the two terminals in a second direction Y perpendicular to the first direction X;

roughly determining all the wiring routes connecting each two-terminal unit in which the distance between the two terminals is larger than the specific interval L;

dividing the routing area into a group of small areas, each small area having a specific width and length which are identical to the specific interval L;

composing a group of medium areas which are respectively formed by combining four small areas in close proximity, each medium area being a square and the side length of the area being 2L which is twice as large as the specific interval L; and roughly and simultaneously determining all wiring routes of the two-terminal units in which the distance between the two terminals is smaller than the specific interval L in the medium areas conceivable as the combination of four small areas in close proximity.

In the above configuration, the wiring routes of the two-terminal units, in which the distance between the two terminals is larger than the side length L of the small area, are roughly determined in advance by utilizing a computer. Then, in each medium area, the wiring routes of the two-terminal units, in which the distance between the two terminals is smaller than the side length L of the small area, are simultaneously and roughly determined by utilizing a plurality of computers in parallel.

By the above two steps, the wiring routes of all the two-terminal units can be simultaneously determined in parallel.

The reason why the wiring routes of all the two-terminal units are determined is as follows.

First, an X-Y coordinate is determined on the semiconductor integrated circuit. Then, a larger interval between an X directional interval and a Y directional interval in the two-terminal unit is adopted as a distance between two terminals. That is, the direction of the adopted distance between two terminals is identical to the X direction or the Y direction. In other words, the direction of the adopted interval is identical to the side direction of the small areas and the medium areas.

Therefore, in an area in which three small areas are positioned in line, the two-terminal units in which the distance between two terminals is smaller than the specific interval L cannot extend to the three small areas. The reason is because the side length of the small area is equal to L.

Accordingly, when a group of medium areas, which are respectively formed from the four small areas in close proximity and form squares having the side length 2L, are composed in every conceivable case as the combination of four small areas to make a square area. all the two-terminal units having the two terminals interval smaller than the specific interval L are necessarily included in any medium area respectively.

Therefore, if each rough wiring route of the two-terminal units having a two-terminal interval larger than the side length L of the small area is determined in advance, finally, the wiring routes of all the two-terminal units are necessarily determined.

It is preferable that the prescribed cumulative value in the step of calculating the specific interval L between two terminals be 0.8 to 0.9.

In the above configuration, the side length L of the small area is found to determine the rough wiring routes the most rapidly. Empirically, when the rough wiring routes of 80 to 90% two-terminal units are determined in the medium areas, the rough wiring routes of the two-terminal units are determined the most rapidly.

It is preferable that the step of determining roughly the wiring routes of the two-terminal units in which the distance between the two terminals is smaller than the specific interval L include:

determining roughly the wiring routes of two-terminal units in the remaining medium areas adjoining the medium area in which the wiring routes have been already determined by a processor, the processor determining the wiring routes in the medium areas one by one.

In the above configuration, the number of medium areas which could conceivably be combinations of four small areas is enormously larger than that of server computers (processors) which have respectively processed the medium areas one by one.

Accordingly, all server computers can efficiently determine the wiring routes of the medium areas one by one.

It is preferable that the medium areas in the step of determining roughly all wiring routes in which the distance between two terminals ls smaller than the interval L be not geometrically overlapped and determined the wiring routes simultaneously.

In the above configuration, when the wiring routes are simultaneously determined in parallel in some medium areas by utilizing a plurality of server computers, each medium area does not geometrically overlap with the other medium areas which are being processed by the control of a single client computer.

A second object of the present invention is achieved by the provision of a method for automatically determining wiring routes among terminals according to rough wiring routes determined on a routing area comprising:

determining a group of detail routing areas which are formed from a plurality of rough cells;

precisely determining detail routes in each first detail routing area to connect the detail routes with the other determined detail routes or the rough wiring routes which exist in the second detail routing areas adjoining the first detail routing area; and precisely determining wiring routes in the all second detail routing areas in the same manner as in the first detail routing area after completing the determination of the wiring routes in the first detail routing area.

In the above configuration, detail wiring (final wiring) routes of some detail routing areas are simultaneously determined in parallel by utilizing a plurality of processors by modifying rough wiring routes which are determined in a rough wiring route process.

When a detail wiring route process has been completed in a certain detail routing area on condition that the detail wiring routes pass through rough wired cells adjoining the other detail routing areas. the other detail routing areas adjoining the certain detail area are simultaneously processed in parallel by each processor in the same manner.

Accordingly, by processing each detail routing area in turn, the wiring routes, which are connected among the detail routing areas in the rough wiring route process, can be reliably connected again among the detail routing areas in the detail wiring route process even if the detail wiring routes are determined in the final wiring routes process regardless of the rough wiring routes.

It is preferable that the step of determining wiring routes precisely in the first detail routing area include:

determining simultaneously wiring routes in a plurality of first detail routing areas by using a plurality of processors in parallel.

Also, it is preferable that the step of precisely determining wiring routes in the second detail routing area include:

determining simultaneously wiring routes in a plurality of second detail routing areas by using a plurality of processors in parallel.

In the above configuration, the detail routing areas are simultaneously processed by using a plurality of processors.

Accordingly, each processor can be efficiently operated and the detail wiring route process is quickly completed.

First and second objects of the present invention are simultaneously achieved by the provision of a method for roughly determining wiring routes among terminals which are arranged on a routing area and have the same electric potential, and then precisely re-determining rewiring routes, comprising:

separating the terminals to a group of two-terminal units in which the Manhattan length between two terminals in a unit is statistically shortened to the minimum on condition that all the terminals are electrically connected through wiring routes connecting each two-terminal unit;

calculating a specific interval L between the two terminals, the interval L corresponding to a prescribed cumulative value in a statistical distribution of the distance between two terminals in the unit and being equal to the larger of a interval $\Delta x$ between the two terminals in a first direction X and another interval $\Delta y$ between the two terminals in a second direction Y perpendicular to the first direction X;

roughly determining all the wiring routes connecting each two-terminal unit in which the distance between the two terminals is larger than the specific interval L, the wiring routes being determined one by one by utilizing a single computer;

dividing the routing area into a group of small areas, each small area having a specific width and length which are identical to the specific interval L;

composing a group of medium areas which are respectively formed by combining four small areas in close proximity, each medium area being a square and the side length of the area being 2L which is twice as large as the specific interval L;

roughly and simultaneously determining all wiring routes of the two-terminal units in which the distance between the two terminals is smaller than the specific interval L in the medium areas conceivable as the combination of four small areas in close proximity, the wiring routes being determined by utilizing a plurality of computers;

precisely determining detail routes in each first small area to connect the detail routes with the other determined detail routes or the rough wiring routes which exist in the second small areas adjoining the first small area; and precisely determining wiring routes in the all second small areas in the same manner as in the first small area in which the detail routes has been determined by utilizing a plurality of computers.

In the above configuration, the rough wiring routes and the detail wiring routes are consecutively determined by using the same computer system.

Accordingly, the processing time for determining the routes can be largely reduced.

DESCRIPTION OF THE SPECIFIC EMBODIMENT

Preferred embodiment of a method for determining rough wiring routes are described with reference to FIGS. 5 to 15.

Figure 1:
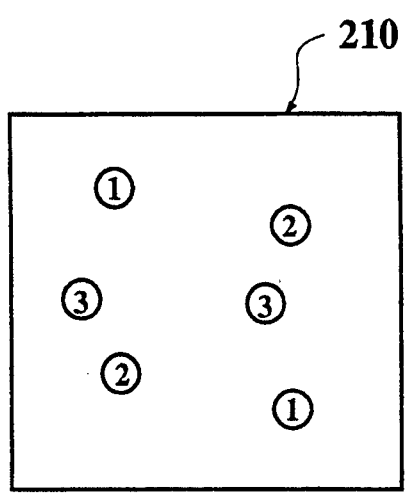
FIGS. 1(a) to 1(d) are schematic views for explaining a conventional method for automatically determining wiring route.
Figure 1:
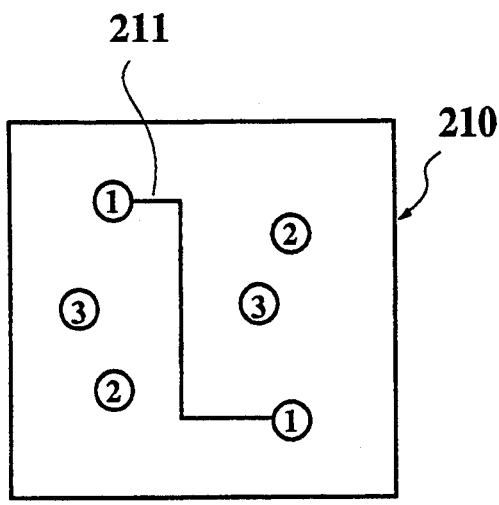
Figure 1:
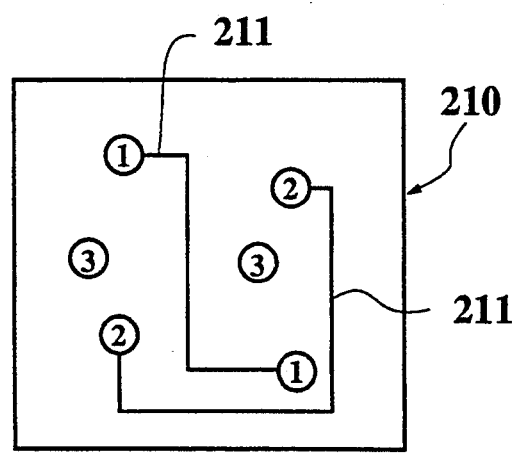
Figure 1:
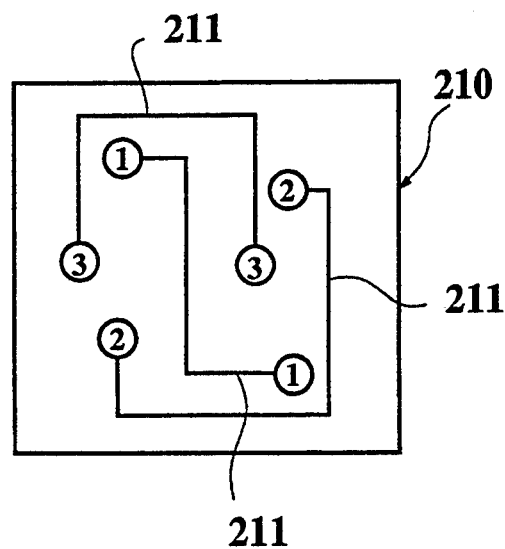
Figure 2:
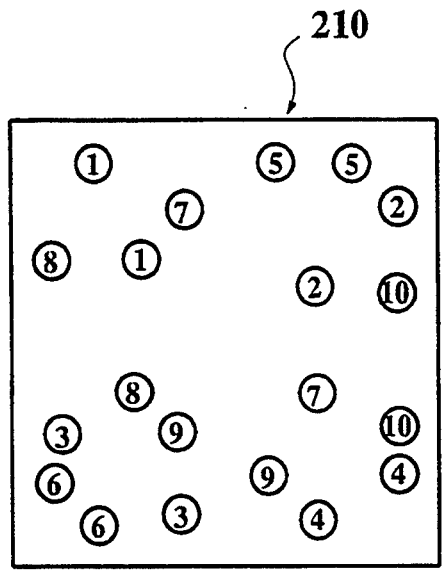
FIGS. 2(a) to 2(d) show wiring routes in a routing area shown in FIG. 1.
Figure 2:
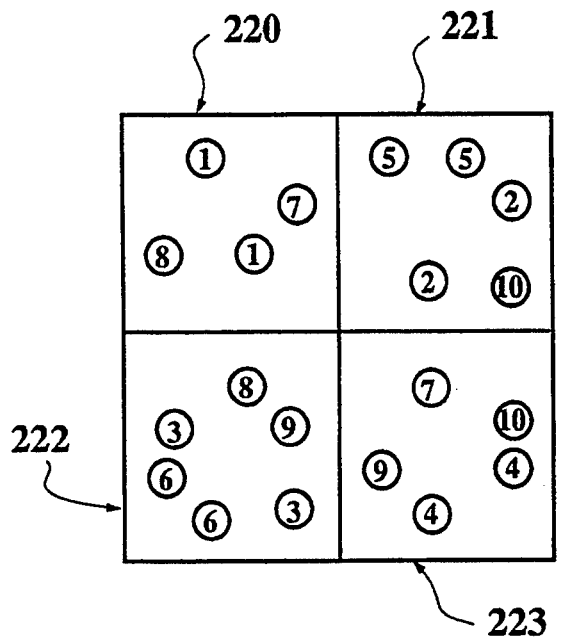
Figure 2:
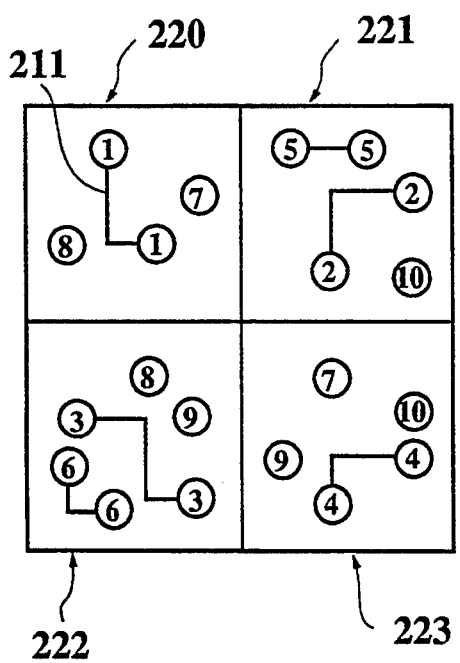
Figure 2:
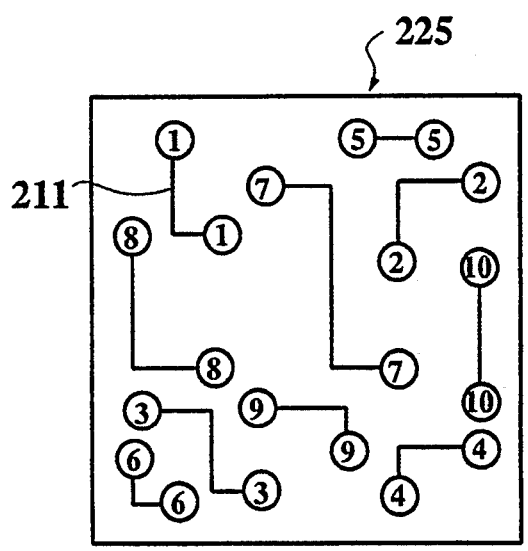
Figure 3:
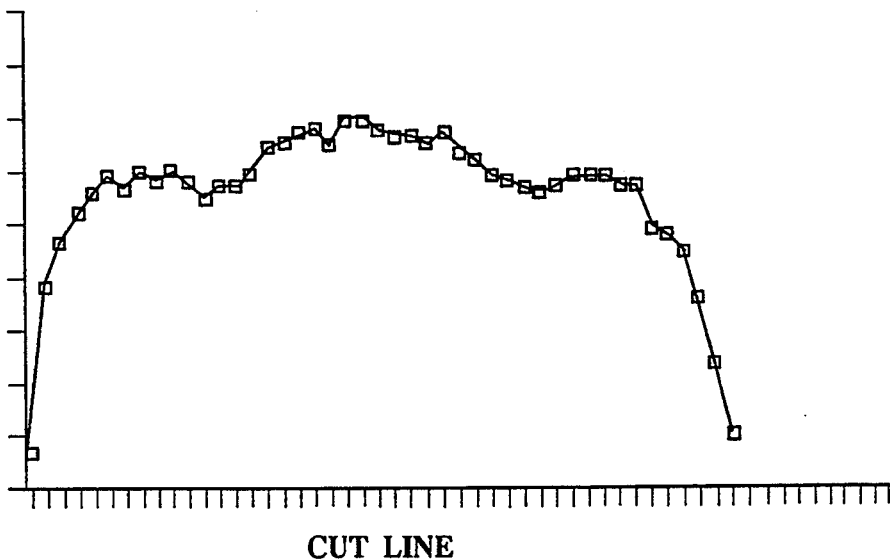
FIG. 3 shows distribution of the wiring routes in a routing area shown in FIG. 1.
Figure 4:
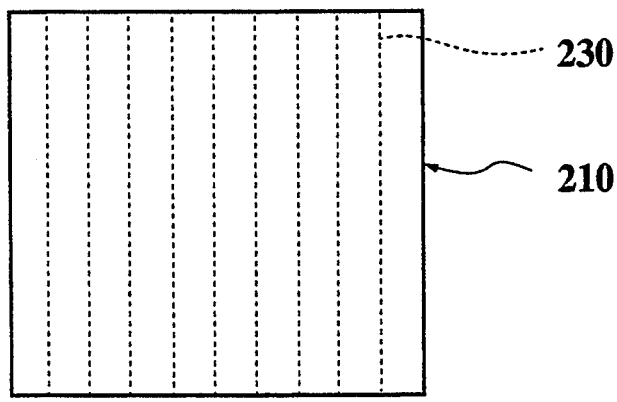
FIG. 4 shows the routing area, shown in FIG. 1, is divided by cut lines to obtain the distribution shown in FIG. 3.
Figure 5:
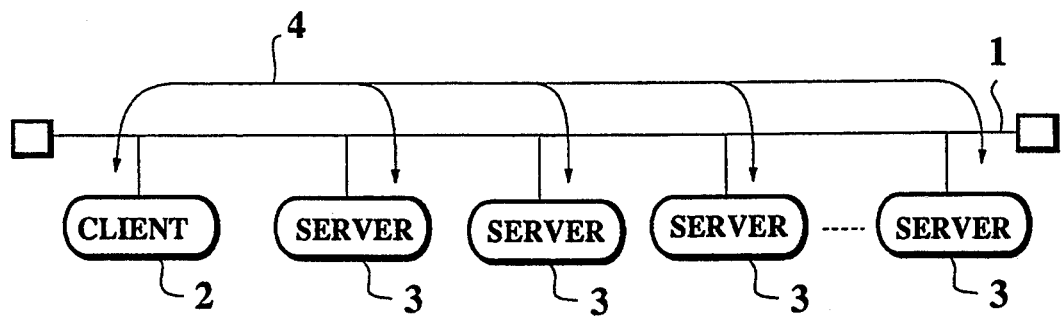
FIG. 5 is a schematic block diagram of a rough system for embodying a method for automatically and roughly determining wiring routes among terminals according to the present invention.
Figure 6:
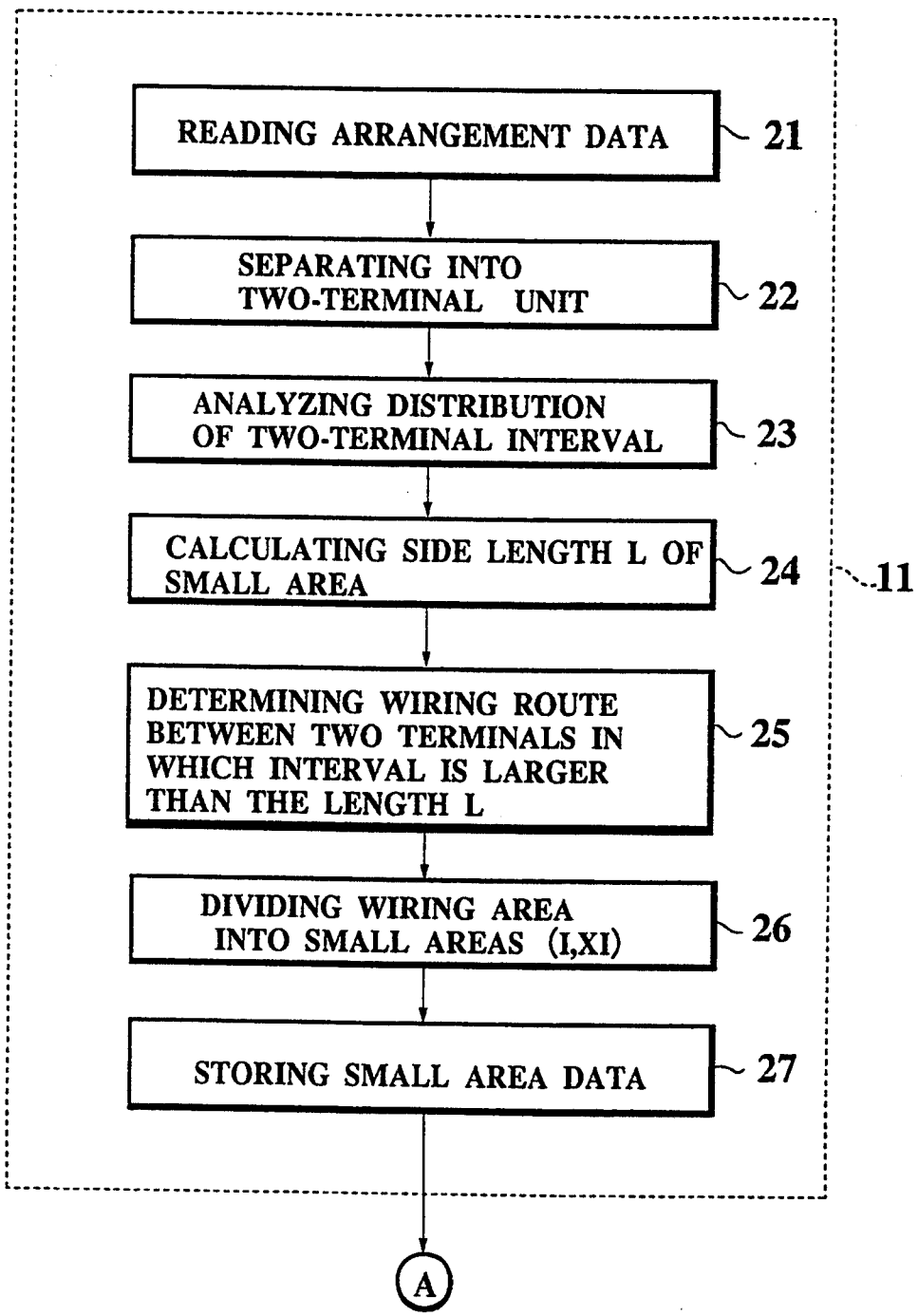
FIGS. 6(a), 6(b) together make up a flow chart showing a method for roughly determining wiring routes according to the present invention by using the system shown in FIG. 5.
Figure 6:
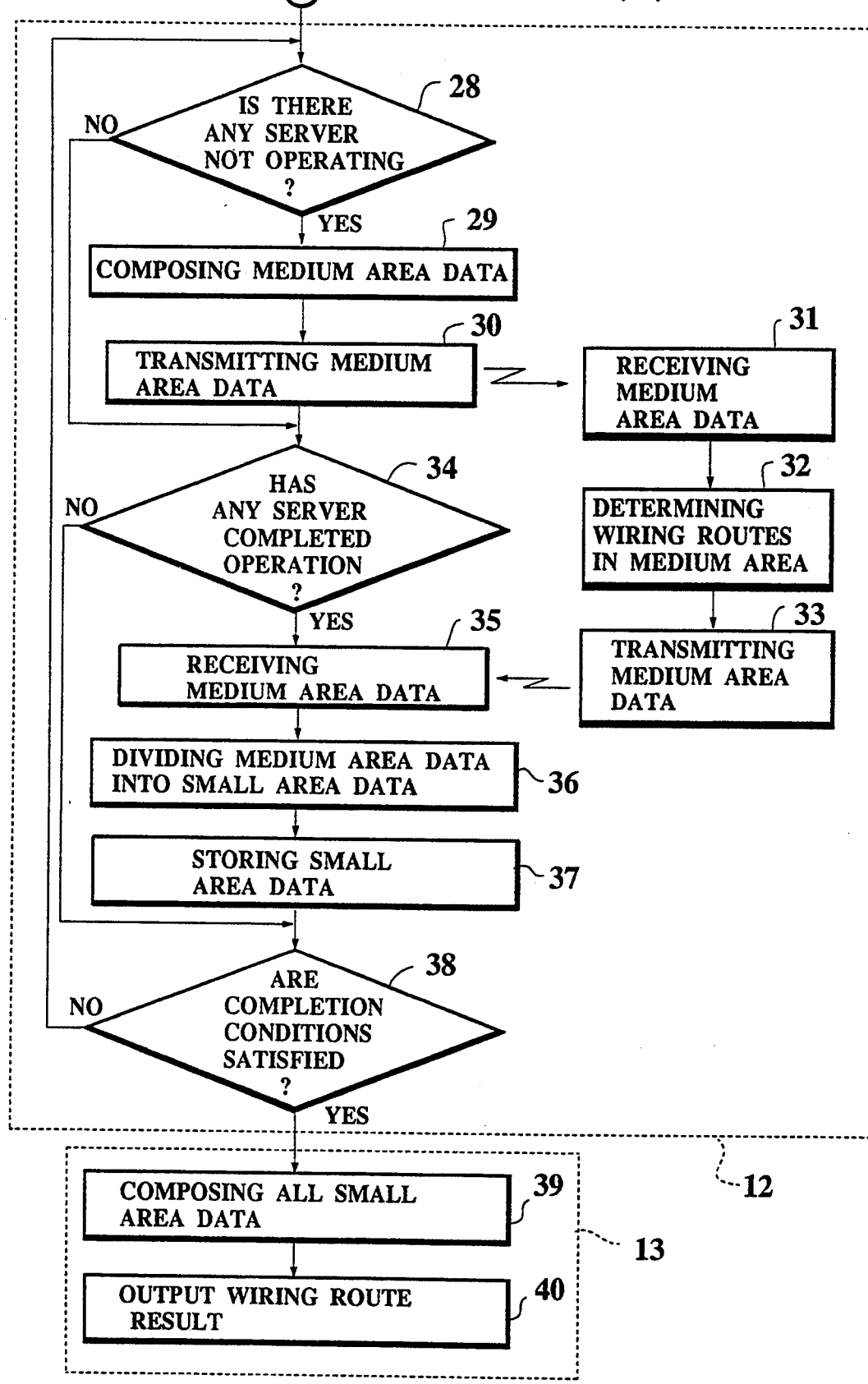
Figure 7:
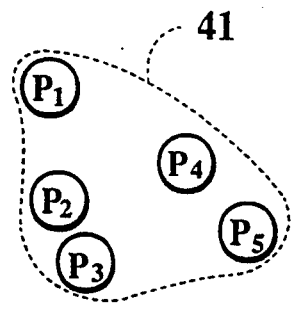
FIGS. 7(a), 7(b) are schematic views for explaining separation to two terminals unit.
Figure 7:
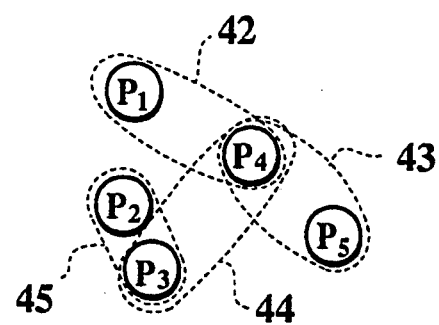

FIG. 5 is a schematic block diagram of a rough system for embodying a method for automatically and roughly determining wiring routes among terminals.

As shown in FIG. S, the rough system for automatically and roughly determining wiring routes among terminals comprises:
- a local area network (LAN) 1 for receiving instructions from a host computer and providing calculated results to the computer;
- a client computer 2 for reading data of devices and terminals for which arrangements have been determined, preprocessing, dividing a routing area into small areas, and composing medium areas by combining four small areas under the control of the instructions received from the LAN 1;
- a plurality of server computers 3 for respectively determining rough wiring routes in the medium area and detail wiring routes in the small area under the control of client 2, each server 3 being simultaneously operated in parallel; and
- data 4 which is calculated in the client 2 and the servers 3, the data 4 being transmitted through LAN 1.

In the above embodiments, the configuration utilizing the LAN 1 is shown. However, a parallel process computer with semiconductor memory device which is used by a plurality of processors is also useful for connecting the processors with a bus. Further, a parallel process computer connected with a plurality of processors by a communication channel may also be used.

In the above configuration, a method for automatically and roughly determining wiring routes among terminals is described as follows.

Figure 17:
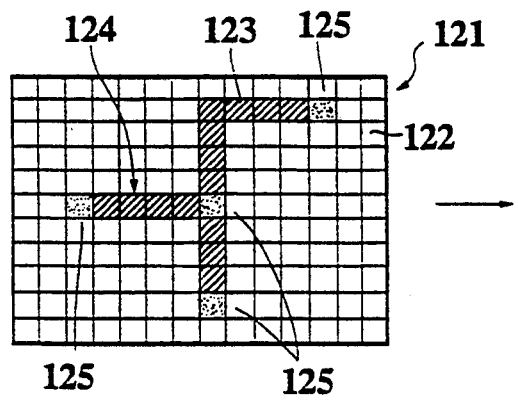
FIGS. 17(a) to 17(f) are, respectively, plane views of a routing area or a detail routing area obtained by cutting the routing area out.
Figure 17:
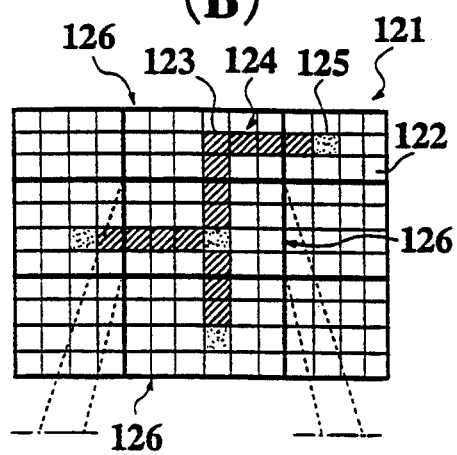
Figure 17:
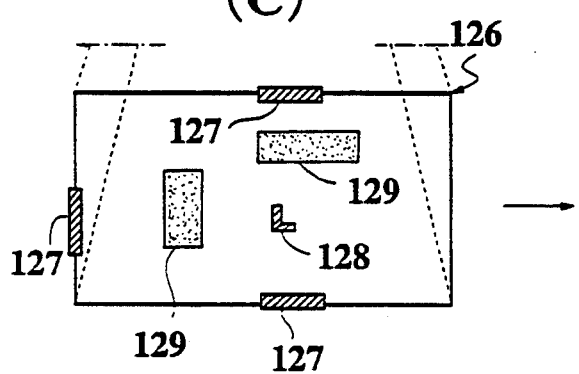
Figure 17:
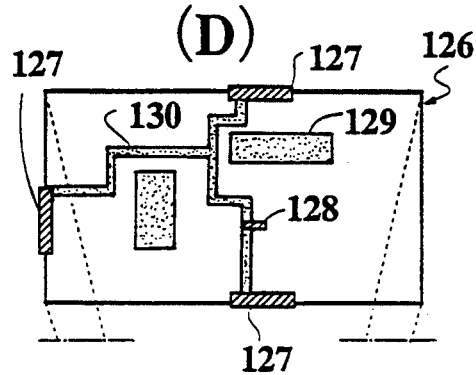
Figure 17:
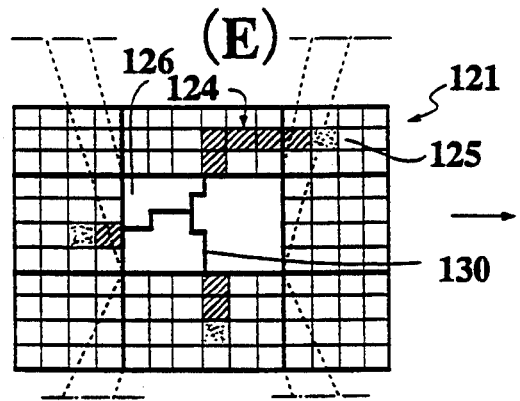
Figure 17:
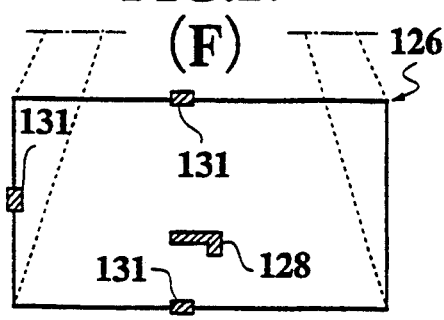

FIG. 17(a) shows a routing area 121 and small areas (rough cell) 122 to explain a local rough wiring route 124.

As shown in FIG. 17(a), the routing area 121 is derided into cells by the control of the client 2 so that a plurality of rough cells 122 are formed. The side length of the cell 122 is larger than the interval of actual wiring grids which are used for a actual wiring process. Therefore, the maximum number of actual wires which can pass through the cell 122 in parallel is determined depending on the side length of the cell 122.

Thereafter, a group of rough wiring cells 123 in which at least a wiring route is determined in the rough wiring route process is specified among the rough cells 122. At this time, the number of rough wiring routes passing through the rough wiring cell 123 does not exceed the number of wires NW because the rough wiring operation is executed to have a prescribed distance between two rough wiring routes. A group of connected rough wiring cells 123 forms a rough wiring route 124. In the rough wiring route 124, a group of terminal cells 125, in which one or more terminals are positioned, are present. A final wiring route is connected with the terminal cells 125.

FIGS. 6(a), 6(b) together make up a flow chart showing a method for roughly determining wiring routes in a routing area.

As shown in FIGS. 6(a), 6(b), the method comprises:
- a process 11 for producing the small areas and determining a part of the wiring routes in the small areas, the process 11 being executed by only the client 2;
- a process 12 for determining the other part of the wiring routes in the small areas, the process 12 being simultaneously executed in parallel by the client 2 and the servers 3;
- a process 13 for summarizing the results obtained in the process 11 and the process 12.

In the process 11, arrangement data of devices and terminals provided to the devices is read by the client 2 in a step 21, and in a step 22 the terminals are separated to a group of two-terminal units in which the distance between two terminals in an unit is shortened to the minimum. The terminals have the same electric potential to form an aggregate.

In detail, the group of two-terminal units is determined by calculating a giant tree of minimum cost in a complete graph in which the terminals are connecting nodes and the Manhattan length between the terminals is a weight of an edge (J. B. Kulskal, "On the shortest spanning subtree of a graph and the traveling salesman problem", Proc. Amer. Math. Soc. 7:1, pp-48-50,1956).

For example. as shown in Flg.7(a), when a net 41 comprising the terminals P1 to P5, is separated to connect all the terminals, a group of two-terminal units 42 to 45 is determined as shown in FIG. 7(b). In this case, the routes between the terminals P1, P4, the routes between the terminals P4, P5, the routes between the terminals P3, P4, and the routes between the terminals P2, P3 are determined in the following steps.

Figure 8:
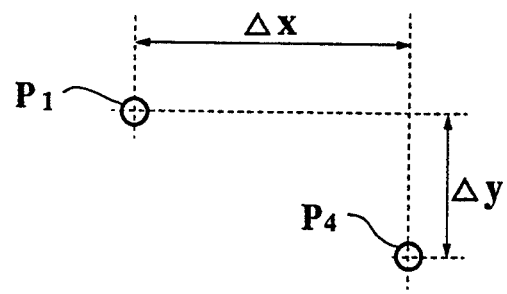
FIG. 8 shows a method for calculating the distance between two terminals.

In a step 23, a statistical probability distribution of the distance between two terminals in each unit is calculated. For example, the interval in the two-terminal unit 42 is determined as shown in FIG. 8. That is, the interval nl is found by executing the following equation as follows.

$$n1 = \text{MAX}(\Delta x, \Delta y)$$

Wherein, $\Delta x$ is a distance between terminals P1, P4 in the X direction (horizontal direction) and $\Delta y$ is another distance between terminals P1, P4 in the Y direction (perpendicular direction) in prescribed X-Y coordinates.

As shown in FIG. 8, because $\Delta x$ is larger than $\Delta y$, the interval nl is equal to $\Delta x$.

Figure 9:
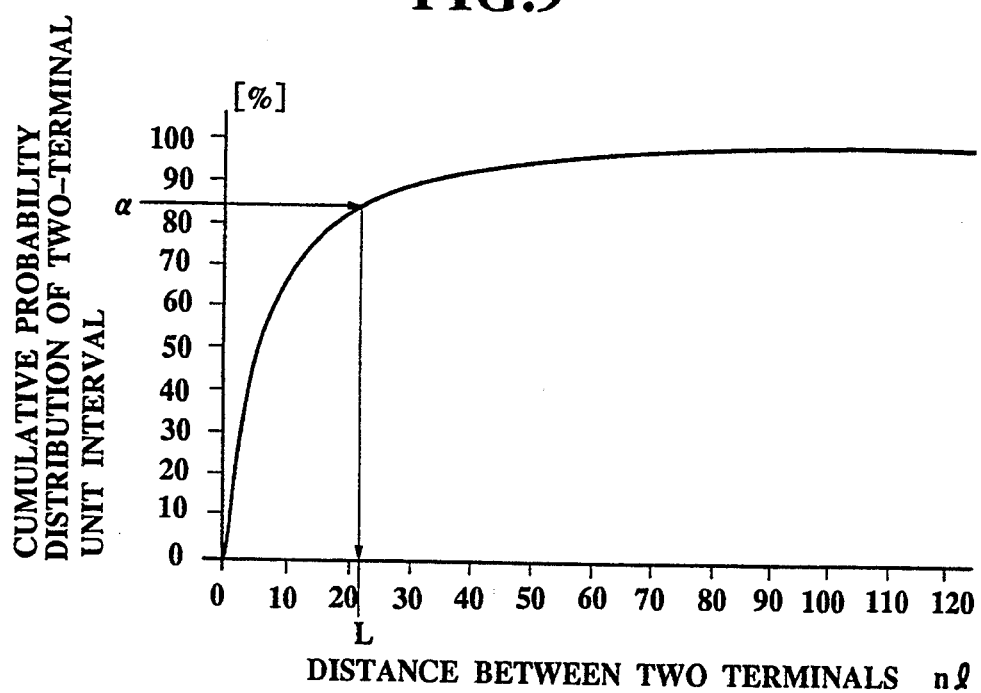
FIG. 9 is a graph showing the cumulative probability distribution of the distance between two terminals.

After finding each interval nl for all the two-terminal units, a cumulative probability distribution of a group of intervals nl is produced and analyzed One example of the cumulative probability distribution is shown in FIG. 9.

As shown in FIG. 9, the interval nl for each two-terminal unit is indicated as the abscissa and the cumulative probability distribution is indicated as the ordinate. The value cp(nl) of the cumulative probability in the distribution is determined according to the following equation.

$$cp(nl) = (n1/nt) \times 100\%$$

Wherein, n1 is the number of two-terminal units in which the distance between the two terminals is smaller than the interval nl and nt is the total number of two-terminal units.

In a step 24, a length L Is determined by using the cumulative probability distribution. Specifically, as shown in FIg. 9. the length L according to a prescribed cumulative value $\alpha$ ($0 \leq \alpha \leq 1$, usually $0.8 \leq \alpha \leq 0.9$) is found. A side length of a square small area, which is composed as described in a later step, is set to the length L.

In a step 25, specific two-terminal units in which the interval nl between two terminals is larger than the length L are selected and the wiring routes connecting the two terminals in the specific units are determined.

The reason that the wiring routes in the specific two-terminal units is determined in advance is because the above wiring routes are not reliably determined in the process 12 as described hereinafter.

Also, the wiring route is determined parallel to the X or Y direction of the X-Y coordinates.

In a step 26, the routing area in the integrated circuit is divided into a group of small areas which are arranged in a cell shape. The side directions of the small area are identical to the X direction and the Y direction of the X-Y coordinates determined in the step 23.

In a step 27, the data for each small area, which is for example the arrangement data for the two-terminal units, is stored in each memory section which is accessed by the client 2. Each item of the data for the small areas has a unique identification number.

Figure 10:
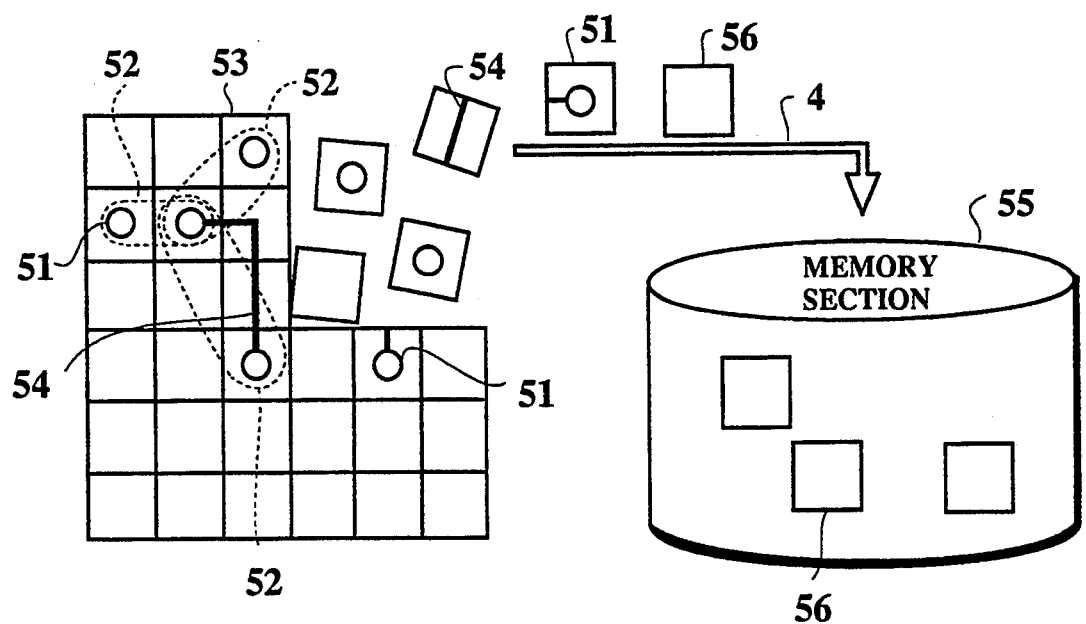
FIG. 10 is a schematic view for explaining a part of the procedure shown in FIG. 6(a).

FIG. 10 shows an explanatory view of the process 11. As shown in FIG. 10, a plurality of terminals 51 with the same electric potential in a routing area 53 are separated into a group of two-terminal units 52. Also, a wiring route 54 in a specific two-terminal unit in which the distance between two terminals is larger than the length L has been determined. Thereafter, the routing area 53 is divided into a plurality of small areas 56, of which the side length are identical to the length L, and these small areas are stored in a memory section 55 of the client 2.

After completing the above steps of the process 11, the client 2 instructs the servers 3 to determine the wiring routes for the small areas in the process 12.

Specifically, in this embodiment, a group of medium areas which are respectively formed from four adjoining small areas are composed. That is, each medium area is a square and the side length of the medium area is 2L which is twice as large as the length L.

A method for composing the medium area is described with reference to FIGS. 11 and 12 as follows.

Figure 11:
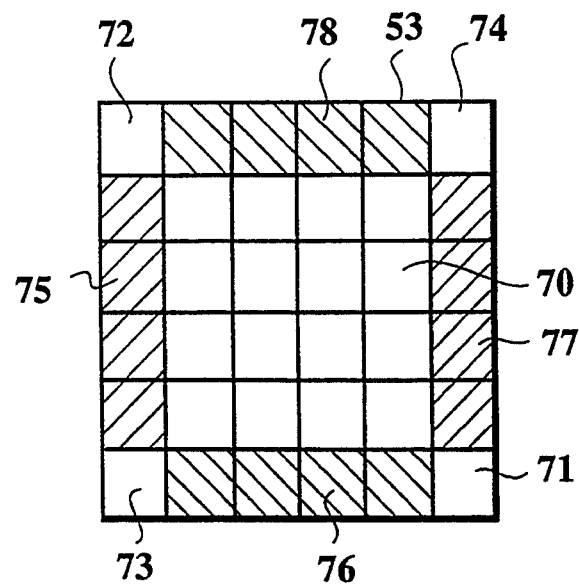
FIG. 11 is a schematic view showing small areas in the routing area.

As shown in FIG. 11, for example, the routing area 53 comprises first small areas 70 which are arranged inside the area 53, second small areas 71 to 74 which are respectively arranged at each corner of the area 53, and third medium areas 75 to 78 which are arranged to the side of the area 53.

In the above small area arrangement, the configuration of a medium area 82 including the specific small area 56 shown in FIG. 12(a) is classified into four types. That is, as shown in FIGS. 12(b) to 12(e), the four types of the medium area 82 are a pattern A, a pattern B, a pattern C, and a pattern D. When the specific small area 56 is the first small area 70, four types of medium areas 82 are composed for determining wiring routes in the specific small area 56. When the specific small area 56 is one of the second small areas 71 to 74, the medium area 82 composed for determining wiring routes in the specific small area 56 is one type among the patterns A to D. When the specific small area 56 is one of the third small areas 75 to 78, the medium area 82 composed for determining wiring routes in the specific small area 56 is two types among the patterns A to D.

Accordingly, the two-terminal units in which the interval nl between the two terminals in each unit is smaller than the length L are necessarily included in two adjoining small areas. This is because the direction of the interval nl is identical to the side direction of the small area.

Therefore, the wiring routes for the two-terminal units in all the small areas can be determined because the wiring routes for the specific two-terminal units with the interval nl larger than the length L have already been determined in the step 25.

Turning to FIG. 6(b), because any server 3 is initially not operated in a step 28, the processing procedure is advanced to a step 29. Therefore, in a step 29, the client 2 reads the data for a prescribed four adjoining small areas to compose a medium area. Then, the data for the composed medium area is transmitted to the server 3 in a step 30.

Figure 12:
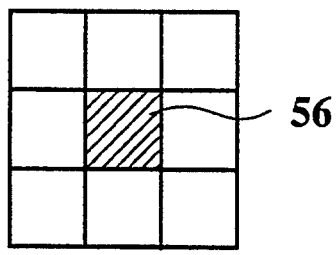
FIGS. 12(a) to 12(e) are schematic views showing four types of medium areas.
Figure 12:
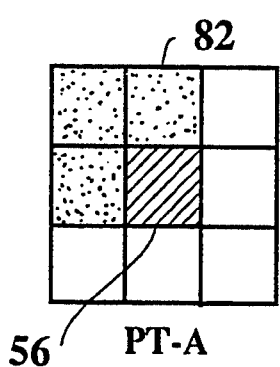
Figure 12:
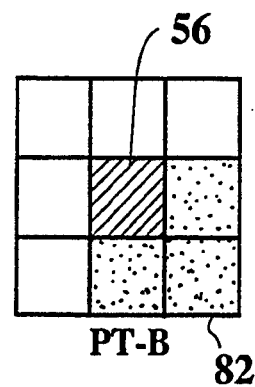
Figure 12:
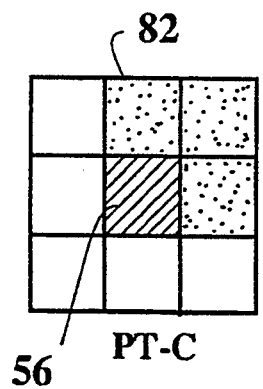
Figure 12:
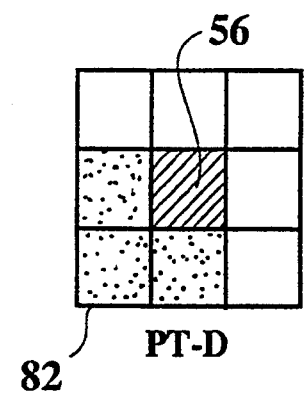

As shown in FIG. 12, the number of medium areas is usually larger than the number of servers 3. Therefore, only some of the medium areas are processed in the servers 3 at a time.

Thereafter. a plurality of servers 3 respectively receive the data for each medium area in a step 31, and each server 3 determines the wiring route between two nonwired terminals in the medium area in a step 32. Each wiring route is determined parallel to the X or Y direction of the X-Y coordinates. Also. the servers 3 are simultaneously operated in parallel. When the servers 3 have determined the wiring routes in the received medium area. the data for the wiring routes is returned to the client 2 in a step 33.

When the client 2 detects the server 3 which has determined the wiring route in a step 35, the client 2 divides the wiring route data in the medium area to the four small area data in a step 36. Then, the divided data is stored in the memory section 55 of the client 2 in a step 37.

In a step 38, because the determination of the wiring routes in all medium areas has not been finished, the procedure for determining the wiring routes in the medium area is returned to the step 28 and the processing procedure is continued.

In short, the client 2 composes a new medium area. in which the wiring route has not been determined, to determine the wiring route. At this time. if the new medium area composed by the client 2 geometrically overlaps with the other medium area which is being processed, the server 3 for processing the new medium area stands by until the other medium area is processed and divided into four small area to store the data in the step 37.

The reason that the server 3 stands by is as follows.

When the wiring routes for a certain two-terminal unit is determined in a plurality of medium areas, the wiring routes are apt to differ because many wiring routes can be conceived to connect the two terminals In the certain two-terminal unit. Therefore, the processing for the other medium area must stand by.

When the processing for the other medium area is completed, the new medium area is processed through the steps 30 to 38.

Accordingly, the wiring route process in the medium areas can be simultaneously executed in parallel if the medium areas do not overlap geometrically. In other words, when the routing area 53 is divided into 4N small areas, all the small areas can be simultaneously processed by N servers 3 because N medium areas can be simultaneously composed from the 4N small areas without overlapping. In practice, the number of medium areas is several hundreds so that the number of the servers 3 is smaller than the number of medium areas.

In the step 28, when all the servers 3 are being processed, the procedure is advanced to the step 34 to detect a server 3 which has completed processing. When no server 3 has finished processing, the procedure is repeated in the steps 28, 34, and 38. When the client 2 detects a server 3 which has completed processing in the step 34, the client 2 receives the medium area data in the steps 34, 35 and the next steps are repeated in the same manner.

When nine completing conditions are satisfied in the step 38, the procedure is advanced to the process 18.

The completing conditions are as follows.
(1) Each small area 70 has been processed into all the four types of medium areas 82 as shown in FIGS. 12(b) to 12(e).
(2) The small area 71 has been processed into the medium area of the pattern A as shown in FIG. 12(b).
(8) The small area 72 has been processed into the medium area of the pattern B as shown in FIG. 12(c).
(4) The small area 73 has been processed into the medium area of the pattern C as shown in FIG. 12(d).
(5) The small area 74 has been processed into the medium area of the pattern D as shown in FIG. 12(e).
(6) Each small area 75 has been processed into both medium areas of the patterns B and C as shown in FIG. 12(c), 12(d).
(7) Each small area 76 has been processed into both medium areas of the patterns A and C as shown in FIG. 12(b), 12(d).
(8) Each small area 77 has been processed into both medium areas of the patterns A and D as shown in FIG. 12(b), 12(e).
(9) Each small area 78 has been processed into both medium areas of the patterns B and D as shown in FIG. 12(c), 12(e).

In the process 13, the client 2 reads the data for all the small areas from the memory section 55 and composes the wiring routes in the routing area 53 in a step 39. Then, the result of all the wiring routes is output in a step 40.

Accordingly, because the medium areas are composed for the four patterns A to D as shown in FIG. 12 and the wiring routes are determined, all the wiring routes for the two-terminal units can be determined in the processes 11 and 12.

FIGS. 13(a) to 13(c) show an explanatory view of the process 12.

Figure 13:
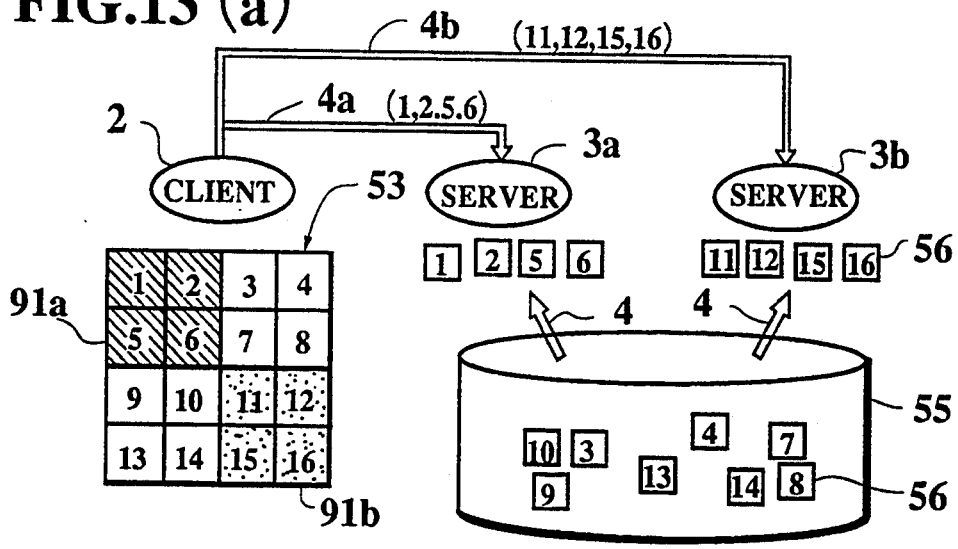
FIGS. 13(a) to 13(c) are schematic views for explaining another part of the procedure shown in FIG. 6(b).
Figure 13:
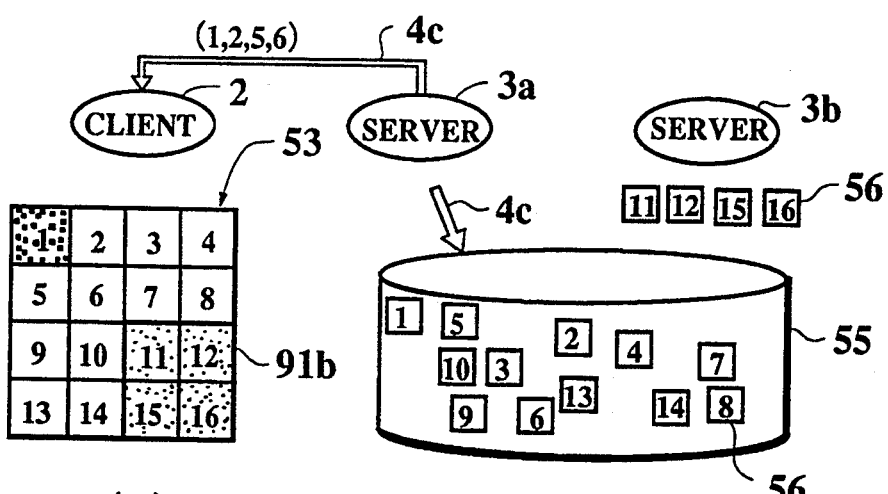
Figure 13:
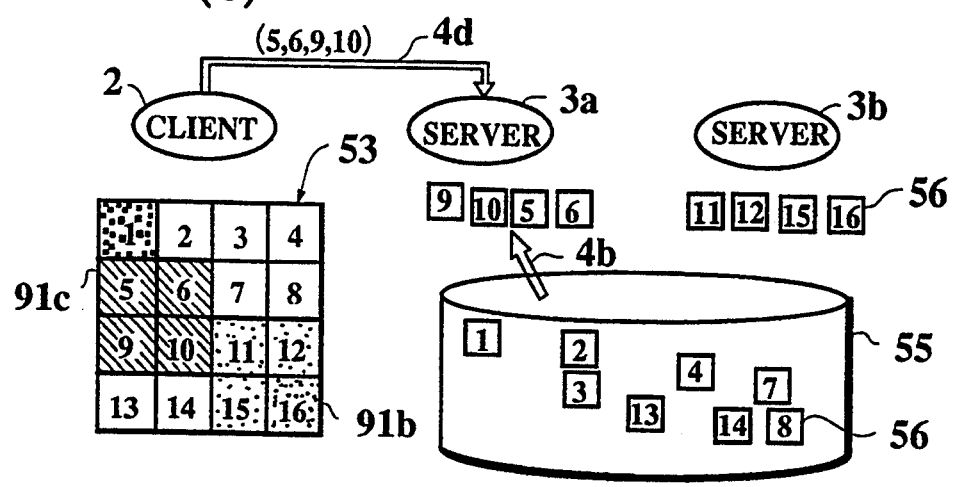

In this embodiment shown in FIG. 13, the routing area 53 is divided into sixteen small areas 56(1 to 16) and medium areas 91 are composed from four adjoining small areas. The wiring routes of the medium areas are simultaneously determined in parallel by using two servers 3.

FIG. 13(a) shows the steps 28 to 32 explaining that the small areas 56(1, 2, 5, and 6) are combined to compose a medium area 91a and the small areas 56(11, 12, 15, and 16) are combined to compose a medium area 91b. The data 4a for the medium areas 91a is transmitted to the first server 3a and the data 4b of the medium areas 91b is transmitted to the second server 3b. Each server 3 determines the wiring route in the medium area 91 after receiving the data 4.

FIG. 13(b) shows the steps 33 to 37. As shown in FIG. 13(b), the server 3a provides the data 4c for the medium area 91a to the client 2 after determining the wiring routes in the medium area 91a. In the client 2, the medium area 91a including the received data 4c is divided into the small areas 56(1, 2, 5, and 6) so that the data 4c for each small area is stored in the memory section 55.

By the determination of the wiring routes, the wiring route process in the medium area 91a of the pattern A shown in FIG. 12(b) is completed.

Therefore, the wiring routes of the two-terminal units included in the small area 56(1) are completely determined, and the other wiring routes of the other two-terminal units which extend from the small area 56(1) to the small areas 56 (2, 5, or 6) are completely determined.

FIG. 13(c) shows the steps 28 to 32 which are repeated after the determination of the wiring routes in the medium area 91a.

As shown in FIG. 13(c), in the client 2, the small areas 56(5, 6, 9, and 10) are combined to compose a medium area 91c after the determination of the wiring routes in the medium area 91a.

The data 4d for the new medium area 91c is transmitted to the server 3a to determine the wiring routes in the new medium area 91c.

The medium area 91c does not overlap with the medium area 91b geometrically because the medium area 91b is being processed.

Accordingly, in a plurality of servers 3, the wiring routes in a plurality of the medium areas can be simultaneously determined in parallel.

Next, the estimation of the processing speed for roughly determining the wiring routes is described.

Usually, parallel processing can be estimated by the following equation.

$$P = (Sp + ss)/(Sp/N + Ss) \qquad (1)$$

Wherein, P is the improvement ratio of the processing speed when processors are operated in parallel. Sp is the processing time for determining the wiring routes when only one processor is operated for a certain part which can be processed in parallel. Ss is the processing time for determining the wiring routes when only one processor is operated for a certain part which cannot be processed in parallel. N is the number of processors.

When Ss is equal to zero (Ss=0), P is equal to N (P =N). This means that N times high speed can be achieved by utilizing N processors. When P is equal to N, the ideal high performance for determining the wiring routes in parallel processing is aehleved. Therefore, when Ss is small and N is large, the performance in parallel processing can be improved.

In the present lnventlon, Ss is the processing time for executing the process 11 by utilizing only the client 2 as shown in FIG. 6(a). Sp Is the processing time for determining the wiring routes when only one server 3 is operated in the process 12 which can be simultaneously processed by utilizing a plurality of servers 3 in parallel.

To slmplify the explanation, the process 11 is considered to include only the step 25 because the processing time at the process 11 is almost spent for the step 25. Moreover, the processing time for determining one wiring route is considered to be constant.

According to the present invention, as the number of two-terminal unlts in which the interval nl is larger than the length L increases, Ss is larger. Therefore, the performance in parallel processing deteriorates. Also, as the number of small areas obtained by dividing the routing area 53 is smaller, the performance of the parallel processing deteriorates because the number of processors being simultaneously operated in parallel has decreased. This tendency depends on the length L determined in the step 24 and the cumulative value $\alpha$ ($0 \leq \alpha \leq 1$).

According to the above simplification, $Ss = Sp(1-\alpha)/\alpha$. Also, when the side length of the routing area 53 is equal to V, the number of small areas is equal to $(V/L)^2$. In this case, $N=(V/L)^2/4$ is obtained. Therefore, the equation (1) is changed as follows.

$$P = 1/\{4\alpha (L/V)^2 + (1-\alpha)\} \quad (2)$$

Accordingly, when $\alpha$ and V/L is large, the performance of the parallel processing can be improved. Wherein, $(1-\alpha)$ means the ratio of specific processing, which is processing one by one, to all processing. The value $(L/V)^2$ is inversely proportional to the number of small areas.

Next, the distribution of the interval nl of the two-terminal unit In a real circuit in which the two-terminal units have been arranged by a layout arrangement program is described.

Figure 14:
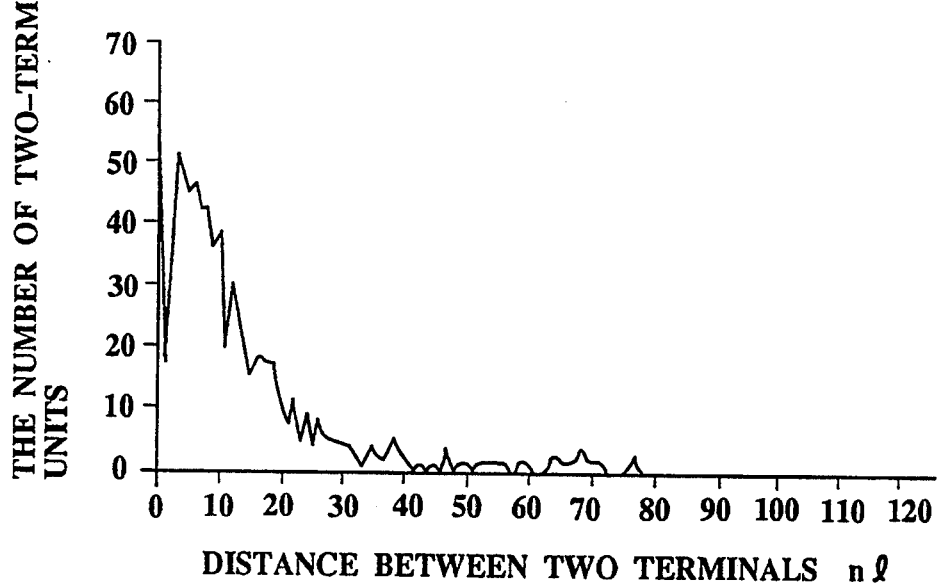
FIGS. 14(a), 14(b) are two-terminal unit distribution graphs of a certain circuit in which the number of gates is 500 and the number of two-terminal units is about 1700.
Figure 14:
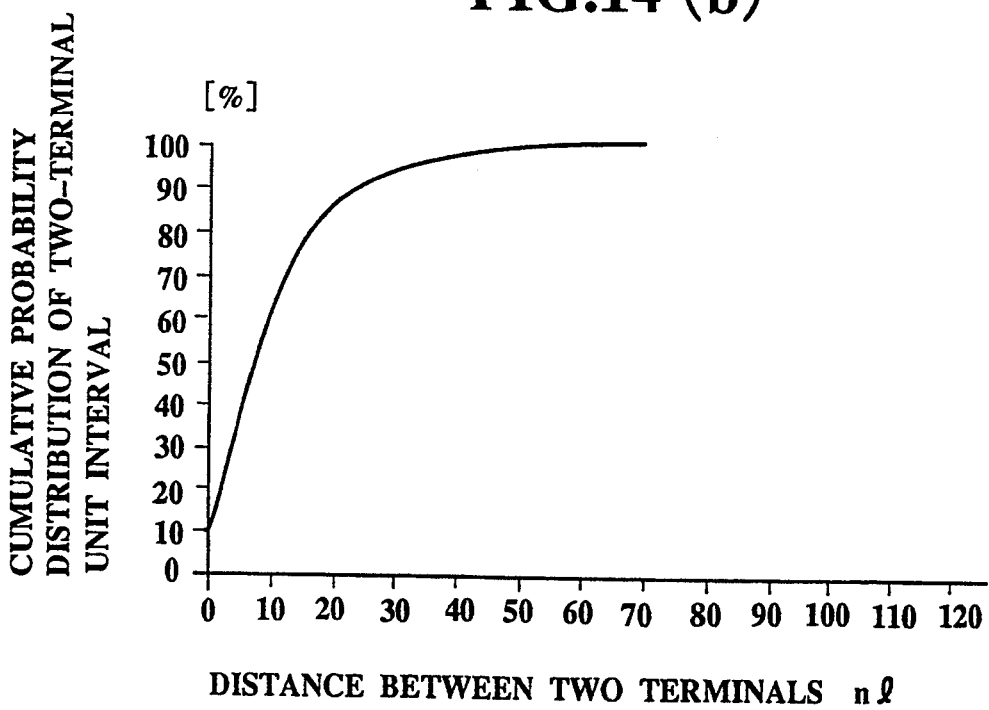
Figure 15:
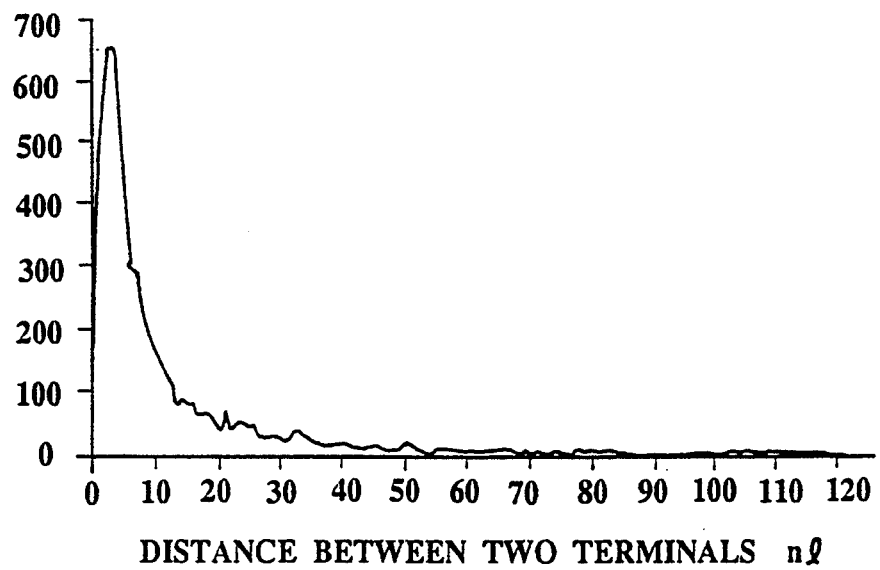
FIGS. 15(a), 15(b) are two-terminal unit distribution graphs of a certain circuit in which the number of gates is 38000 and the number of two-terminal units is about 13000.
Figure 15:
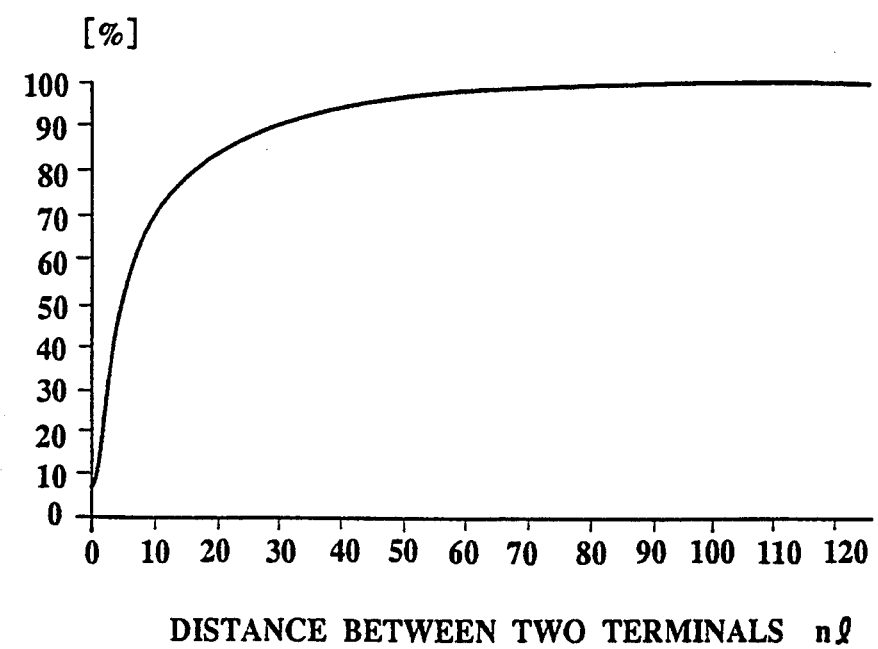
Figure 16:
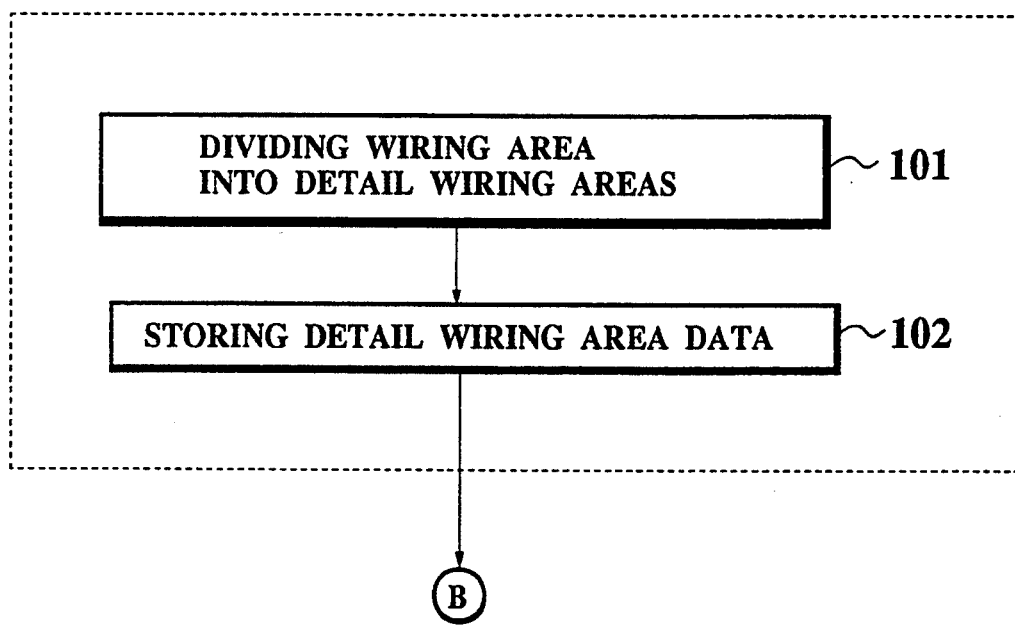
FIG. 16(a), 16(b) together make up a flow chart showing a method for precisely determining the wiring routes In a routing area.
Figure 16:
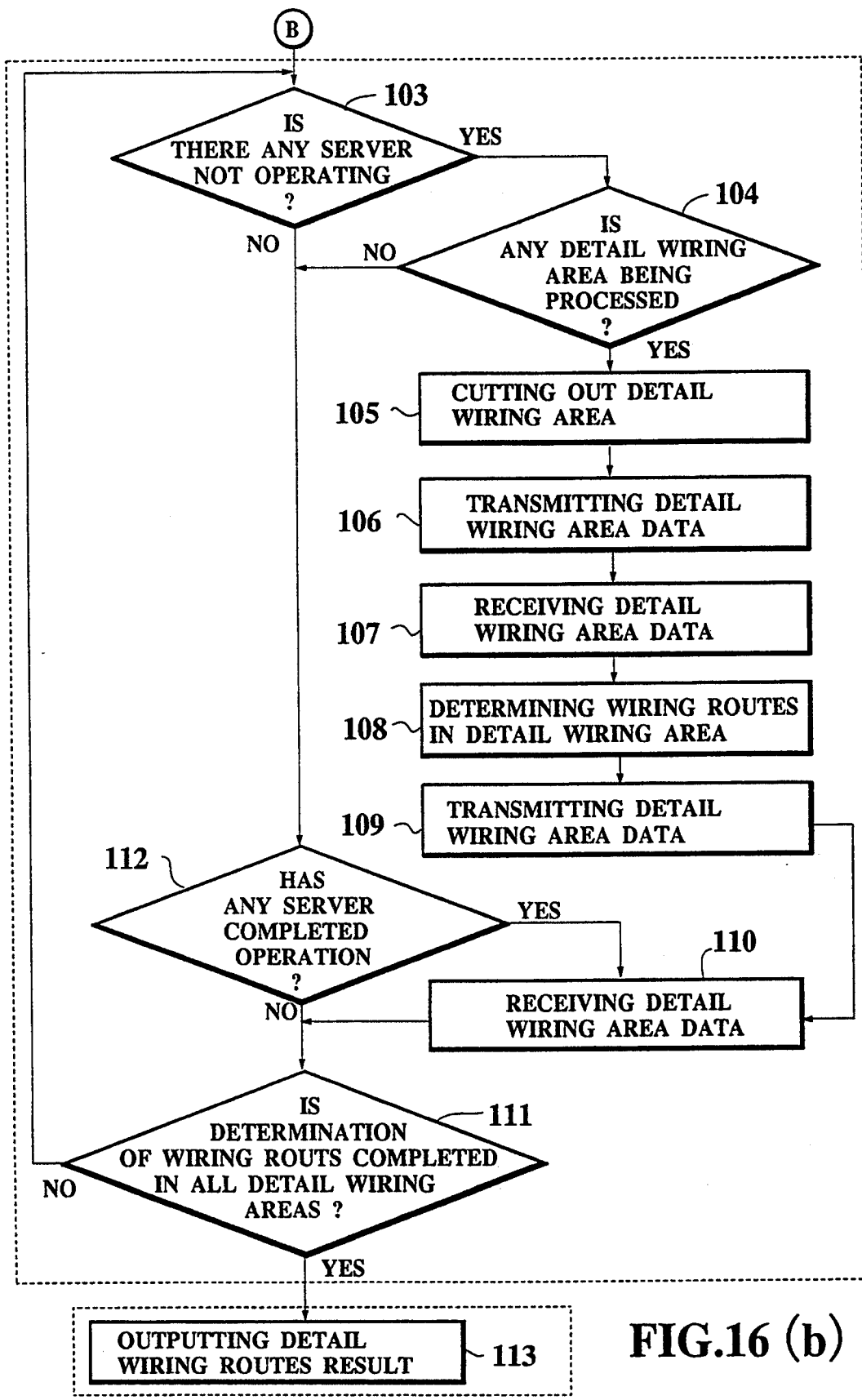

FIG. 14 is the two-terminal unit distribution graph of a certain circuit in which the number of gates is 500 and the number of two-terminal units is about 1700. FIG. 15 is the two-terminal unit distribution graph of a certain circuit in which the number of gates is 38000 and the number of two-terminal units is about 13000. Specifically, FIGS. 14(a), and 15(a) show respectively the frequency distribution of two-terminal units. FIG. 14(b), and 15(b) show respectively the cumulative probability distribution.

As shown in FIGS. 14, 15, the two-terminal units cluster around the smaller interval nl. Also, this tendency does not depend on the scale of the circuit or the size of the routing area. Therefore, the length L of the small area is small even if the cumulative value $\alpha$ is large. Also, the length L does not depend on the scale of the circuit so that the size of the small area is almost constant. This is because the cumulative probability distribution does not depend on the scale of the circuit or the size of the routing area.

Accordingly, as the scale of the circuit increases, V/L increases so that the number of small areas is larger. That is, the layout of the wiring routes in the large scale integrated semiconductor can efficiently be executed in a practical processing time.

In the above embodiments, the wiring routes of the specific two-terminal units in which the interval nl between the two terminals is larger than the length L are determined In the step 25 of the process 11 as shown in FIG. 6(a). However, it is preferable that the determination of the wiring routes be executed after the process 12.

Next, the preferred embodiment of a method for precisely determining wiring routes are described with reference to FIGS. 16 to 20.

A detail system for automatically and precisely determining wiring routes among terminals comprises:
 the local area network (LAN) 1;
 the client computer 2; and
 the server computers 3.

In the above configuration, a method for automatically and precisely determining detail wiring routes (final wiring routes) in the system is described as follows.

FIGS. 16(a), 16(b) together make up a flow chart for precisely determining the wiring routes in a routing area. FIGS. 17(a) to 17(f) are respectively plane views of a routing area or a detail routing area obtained by cutting the routing area out.

Initially, in a step 101, the routing area 121 is divided to compose a group of detail routing areas 126 after determining the rough wiring route 124 as shown in FIG. 17(b). In each derall routing area 126, a prescribed number of rough cells 122 are included.

In a step 102, the data for the detail routing areas 126 is stored in the memory section 55 by the control of the client 2.

In a step 103, because any server 3 is initially not operated and any detail routing area 126 is not processed, the processing procedure is advanced to a step 105 through a step 104. Therefore, in the step 105, the client 2 cuts out the detail routing areas 126. In steps 106, 107, each unit of the data for the detail routing areas 126 is transmitted to the corresponding server 8 to determine detail wiring routes.

In a step 108, each unit of the data for the rough wiring routes 124 is erased as shown in Flg. 17(c). On the other hand, line-shaped temporary marks 127 are positioned at specific portions of the periphery of the detail routing areas 126. Each specific portlon is positioned at the rough wiring cell 128 and the length of the temporary mark 127 is identical to the width LW of the rough cell 122. Also, in the detail routing area 126, there are one or more terminals 128 which are actually wired in the wiring process and one or more areas 129 in which wiring is forbidden. The wiring route cannot pass through the wiring forbidden area 129 because of the electric condition.

In the detail routing area 126, the wiring route process for determlnlng the wiring routes to connect among temporary marks 127 and terminals 128 is executed by each server 3 so that detail wiring route 130 is determined as shown in FIG. 17(d).

When the determination of the detail wiring routes 130 is completed, the data for the detail routing area 126 is transmitted to the client in steps 109,110. The transmitted data is stored in the memory section 55. In other words, the data for the routing area 121 is stored in the memory section 55 as shown in Flg. 17(e).

When the data for a detail routing area 126 is stored, the procedure is advanced to a step 111. In the step 111, because the determination of the detail wiring routes 130 has not completed in all the detail routing areas 126, the procedure is returned to the step 103.

In the step 103, each unit of the data for the other detail routing areas 126 adjoining the specific detail routing area 126 in which the wiring routes have been determined is provided to the server 3 to determine the wiring routes. When the servers 3 receiving the data for the other derall routlng areas 126 do not exist, the procedure of the steps 103, 112, and 111 are repeated until a server 3 receiving the data ls detected by the client 2 after the server 3 has completed the determination of the wiring routes in the detail routing area 126.

When the servers 3 receive the data, each determination of the detail wiring routes 130 is simultaneously executed in parallel. At this time, a group of detail routing areas 126, in which the wiring routes are simultaneously determined in parallel by the servers 3, are not adjoining. The reason is as follows.

On condition that a certain rough wiring route 124 extends from a first detail routlng area 126 to a second detail routlng area 126 adjoining the first area 126, when a first detail wiring route 130 is determined in the first detail routing area 126 while a second detail wiring route 130 is determined in the second derall routing area 126, the first detail wiring route 130 does not always connect to the second detail wlrlng route 130. Specifically, the first and second detail wiring routes 130 can respectively pass through any route among several routes in a rough cell 122 because a prescribed number of wires can pass through the rough cell 122.

Therefore, as shown in FIG. 17(f), the detail routing area 126 determining the detail wiring routes 130 is processed as follows.

In the above detail routing area 126 in which the rough wiring route 124 is erased, a pointed connecting mark 131 is arranged at the periphery of the detail routing area 126. The length of the connecting mark 131 is identical to the distance between two final wires.

Turning to FIG. 16(b), when all the detail wiring routes 124 in the routing area 121 are determined in the step 111. The result of the determined detail wiring routes 124 is output by the client 2 in a step 113.

Next, the selection procedures for the detail routing areas 126 to determine the detail wiring routes 124 thereof and the determining procedures for the detail wiring routes 124 are described wlth reference to FIGS. 18(a) to 18(f).

In the routing area 121. as shown in FIG. 18(a), a plurality of rough cells 122 and rough wired cells 123 are arranged by the method for roughly determining the wiring routes. A group of rough wired cells 123 forms a pair of rough wiring routes 124a, 124b.

According to the method for determining the detail wiring routes, the routlng area 121 is divided into a plurality of detail routlng areas 126 as shown in FIG. 18(b). In the periphery of each detail routlng area 126, through which the rough wirlng route 124a, or 124b passes, temporary connecting marks 127a, 127b are respectively arranged. In the subsequent procedure. a final wiring route 130a is determined to be connected with a plurality of terminals 128a through the temporary connecting marks 127a while a final wiring route 130b is determined to be connected with a plurality of terminals 128b through the temporary connecting marks 127b.

In the next step, the final wiring routes 130a, 130b in a central detail routing area 126A are initially determined as shown in FIG. 18(c). Then, the final wiring routes 130a, 130b in four detail routing areas 126B adjoining the central detail routing area 126A are simultaneously determined in parallel as shown in FIG. 18(d). Thereafter, the final wiring routes 130a, 130b in eight detail routing areas 126C adjoining the detail routing areas 126B are simultaneously determined in parallel as shown in FIG. 18(e). In the same manner, the final wiring routes 130a, 130b in eight detail routing areas 126D adjoining the detail routing areas 126C are determined as shown in FIG. 18(f).

In the above case, one detail routing area 126B does not adjoin the other detail routing area 126B. In the same manner, the detail routing areas 126C, 126D do not respectively adjoin the other detail routing areas 126C, 126D.

Accordingly, because the detail routing areas 126 adjoining the other detail routing areas 126 in which the detail wiring routes have been determined are determined the detail wiring routes, a group of detail routing areas 126 can be extended without disconnecting the final wiring routes 130a, 130b. Also, the number of unnecessary curves can be reduced so that the efficiency of the connections in the wiring route process can be improved.

Figure 18:
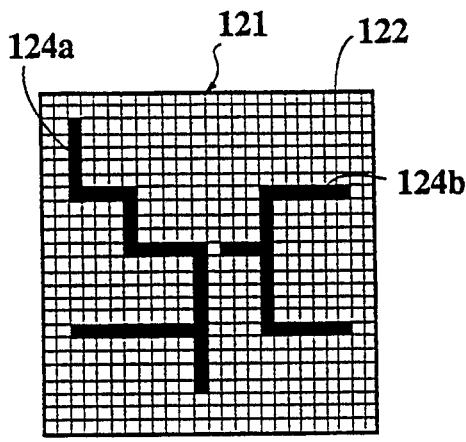
FIGS. 18(a) to 18(f) are schematic views showing selection procedures for detail routing areas.
Figure 18:
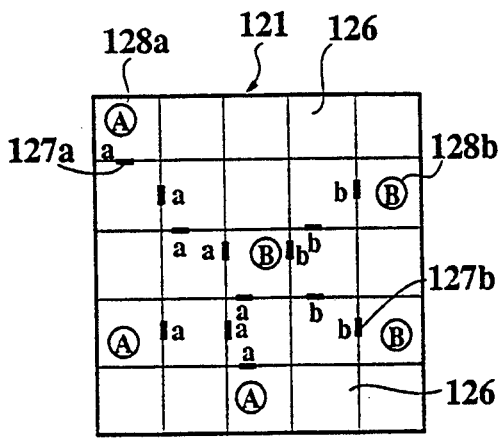
Figure 18:
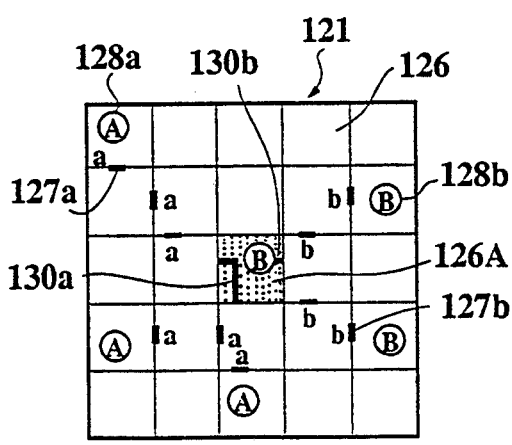
Figure 18:
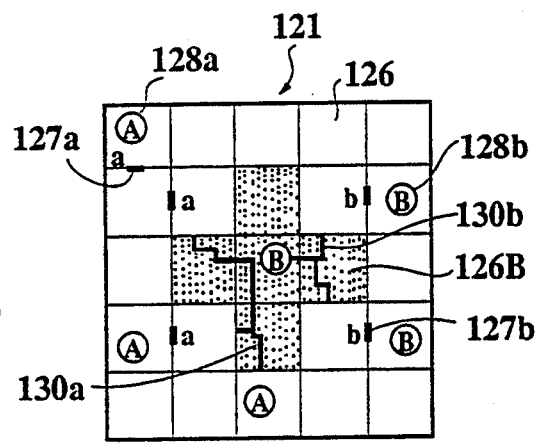
Figure 18:
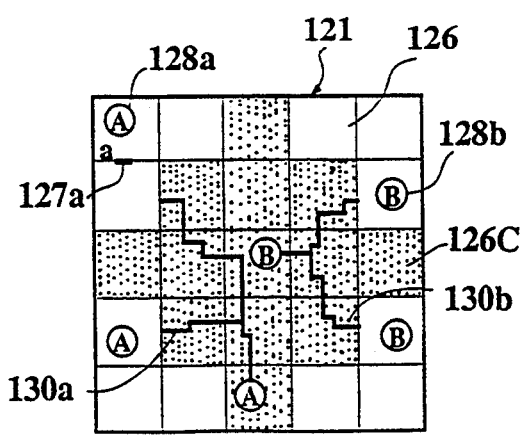
Figure 18:
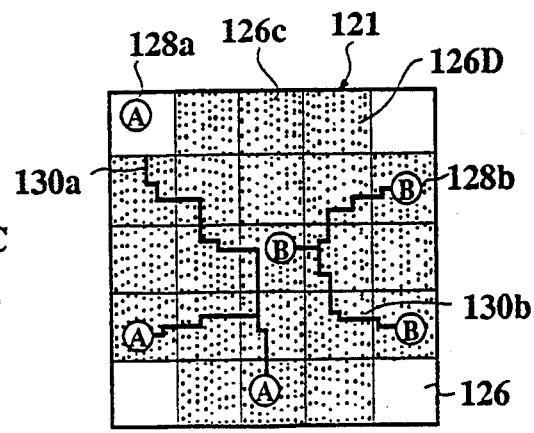
Figure 19:
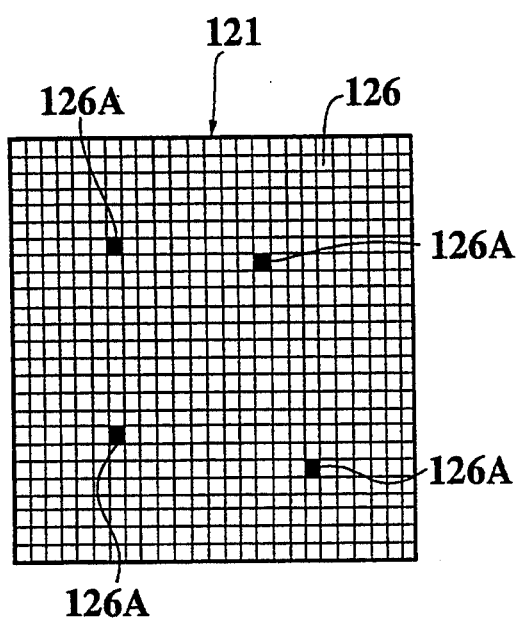
FIG. 19(a) to 19(b) are plane views showing four central routing areas.
Figure 19:
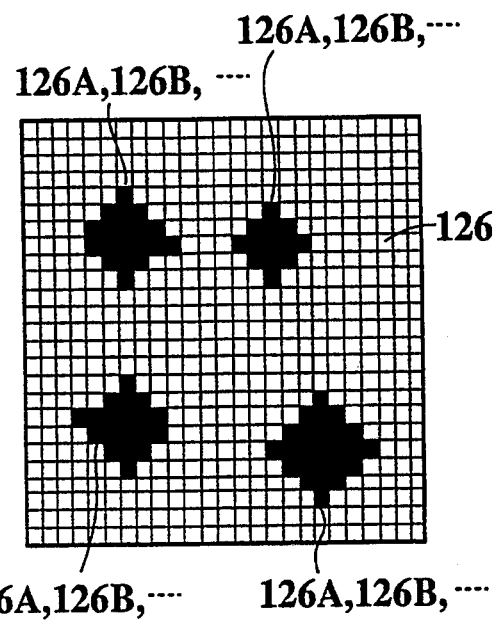

In the embodiment shown in FIG. 18, the detail routing areas 126, in which the wiring routes 130 are to be determined, are extended around the central detail routing area 126A. However, it is preferable that a plurality of central detail routing areas 126A be set as shown in FIGS. 19(a), 19(b).

In FIG. 19(a), there are four central detail routing areas 126A. As shown in FIG. 19(b), four groups of detail routing areas 126, in which the detail wiring routes 130 have been determined, are extended (shown in the black area).

It is preferable that the central detail routing area 126A be arranged at the periphery of the routing area 121.

Accordingly, the servers can always be operated so that the performance of the determination of the wiring routes can be improved. For example, the improvement of the performance in the detail system is shown in FIG. 20.

Figure 20:
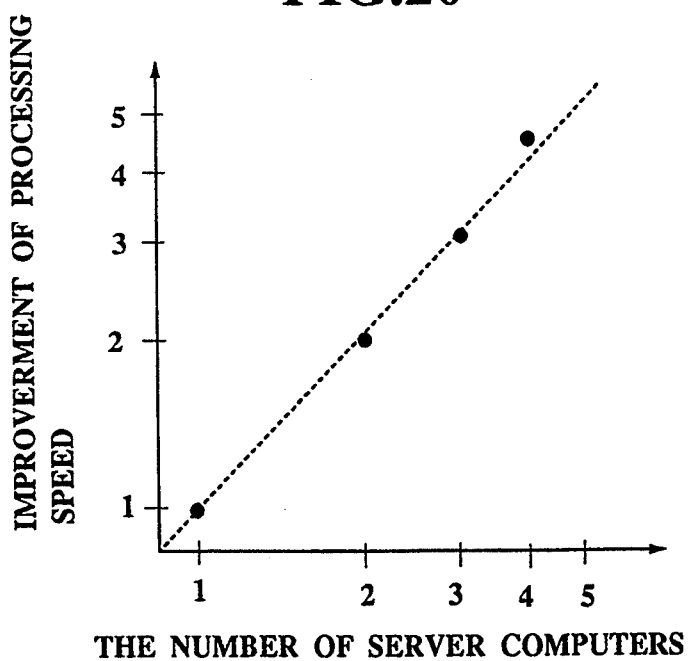
FIG. 20 is a graph showing the improvement of the performance in determining the wiring routes.

FIG. 20 is a graph showing the improvement of the performance for determining the wiring routes by utilizing a prescribed number of servers 3.

In FIG. 20, a broken line shows theoretical improvement of processing speed. On the other hand, black points show real improvement. As shown in FIG. 20, the processing speed is improved proportional to the number of servers 3. In other words, the processing speed is not deteriorated by a communication or data transmission among servers 3 or between server 3 and client 2.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

WHAT IS CLAIMED IS;

1. A method for automatically determining wiring routes among terminals which are arranged on a routing area and have the same electric potential, the method comprising the steps of:

separating the terminals to a group of two-terminal units in which length between two terminals in a unit is statistically shortened to minimum on condition that all the terminals are electrically connected through wiring routes connecting each two-terminal unit;

calculating a specific length L between the two terminals, the length L corresponding to a prescribed cumulative value in a statistical distribution of the distance between two terminals in the unit and being equal to the larger of an interval $\Delta x$ between the two terminals in a first direction X and another interval $\Delta y$ between the two terminals in a second direction Y perpendicular to the first direction X;

globally determining all the wiring routes connecting each two-terminal unit in which the distance between the two terminals is larger than the specific length L;

dividing the routing area into a group of small areas, each small area having a specific width and length which are identical to the specific length L;

composing a group of medium areas which are respectively formed by combining four small areas in close proximity, each medium area being a square and the side length of the area being 2L which is twice as large as the specific length L; and globally and simultaneously determining all wiring routes of the two-terminal units in which the distance between the two terminals is smaller than the specific length L in the medium areas conceivable as the combination of four small areas in close proximity.

2. A method according to claim 1 in which the step of determining the relation of the connection among the terminals includes:

calculating a giant tree of the minimum cost in a complete graph in which the terminals are connecting nodes and Manhattan length between the terminals is a weight of an edge.

3. A method according to claim 1 in which the prescribed cumulative value in the step of calculating the length L between two terminals is 0.8 to 0.9.

4. A method according to claim 1 in which the medium areas in the step of determining roughly all wiring routes in which the distance between two terminals is smaller than the length L are not geometrically overlapped and determined the wiring routes simultaneously.

5. A method according to claim 1 in which the step of determining roughly all wiring routes of two-terminal units in which the distance between two terminals is smaller than the length L includes:

determining roughly wiring routes of two-terminal units in remained medium areas adjoining the medium area in which the wiring routes have been already determined by a processor, the processor determining the wiring routes in the medium areas one by one.

6. The method of claim 1, wherein the medium areas are composed of four small areas each of which is adjacent to other said small areas and wherein the medium areas are composed of four types of patterns which include an adjacent left-below small area, an adjacent right-below small area, an adjacent right-above small area and an adjacent left-above small area.

7. A method for automatically determining wiring routes among terminals according to rough wiring routes determined on a routing area comprising:

determining a group of detail routing areas which are formed from a plurality of global cells;

precisely determining detail routes in each first detail routing area to connect the detail routes with the other determined detail routes or the rough wiring routes which exist in the second detail routing areas adjoining the first detail routing area; and precisely determining wiring routes in the all second detail routing areas in the same manner as in the first detail routing area after completing the determination of the wiring routes in the first detail routing area.

8. A method according to claim 7 in which the step of precisely determining wiring routes in the first detail routing area includes:

determining a first terminal point that a wire can pass through in each specific rough wired cell in which the prescribed number of wires can passing through, the first terminal point being arranged to a first side contacting with the second detail routing area; and the step of precisely determining wiring routes in the second detail routing area includes:

determining a second terminal point that a wire can pass through in each specific rough wired cell, the second terminal point being arranged to a second side contacting with the first side of the first detail routing area.

9. A method according to claim 7 in which the step of precisely determining wiring routes in the first detail routing area includes:

determining simultaneously wiring routes in a plurality of first detail routing areas by using a plurality of processors in parallel.

10. A method according to claim 7 in which the step of precisely determining wiring routes in the second detail routing area includes:

determining simultaneously wiring routes in a plurality of second detail routing areas by using a plurality of processors in parallel.

11. A method for globally determining wiring routes among terminals which are arranged on a routing area and have the same electric potential, and then precisely re-determining rewiring routes, the method comprising the steps of:

separating the terminals to a group of two-terminal units in which length between two terminals in a unit is statistically shortened to the minimum on condition that all the terminals are electrically connected through wiring routes connecting each two-terminal unit;

calculating a specific length L between the two terminals, the length L corresponding to a prescribed cumulative value in a statistical distribution of the distance between two terminals in the unit and being equal to the larger of a interval $\Delta x$ between the two terminals in a first direction X and another interval $\Delta y$ between the two terminals in a second direction $\Delta y$ perpendicular to the first direction X;

globally determining all the wiring routes connecting each two-terminal unit in which the distance between the two terminals is larger than the specific length L, the wiring routes being determined one by one by utilizing a single computer;

dividing the routing area into a group of small areas, each small area having a specific width and length which are identical to the specific length L;

composing a group of medium areas which are respectively formed by combining four small areas in close proximity, each medium area being a square and the side length of the area being 2L which is twice as large as the specific length L;

globally and simultaneously determining all wiring routes of the two-terminal units in which the distance between the two terminals is smaller than the specific length L in the medium areas conceivable as the combination of four small areas in close proximity, the wiring routes being determined by utilizing a plurality of computers;

precisely determining detail wiring routes in each first small area to connect the detail routes with the other determined detail routes or the rough wiring routes which exist in second small areas adjoining the first small area; and precisely determining wiring routes in all the second small areas in the same manner as in the first small area in which the detail routes have been determined by utilizing a plurality of computers.

12. A method according to claim 11, wherein the step of precisely determining detail wiring routes in each small area, further comprises:

selecting detail routing areas which include a plurality of small areas, wherein global wiring routes have been determined by the globally and simultaneously determining step;

marking terminals in the detail routing areas;

marking temporary pointed connecting marks along the periphery of the detailed routing areas representing points where the global wiring routes cross the detail routing areas;

marking forbidden areas where the detail wiring routes cannot cross; and wherein the detail wiring routes are precisely determined such that the length of each route is shortened, connects the terminals, connects the temporary pointed connecting marks and avoids the forbidden areas.

13. A method according to claim 11, wherein the terminals are stationary.

* * * * *